(12) United States Patent
Yang et al.

(10) Patent No.: US 11,217,655 B2
(45) Date of Patent: Jan. 4, 2022

(54) ELECTRONIC DEVICE

(71) Applicant: InnoLux Corporation, Miao-Li County (TW)

(72) Inventors: Shu-Hui Yang, Miao-Li County (TW); Chien-Chih Chen, Miao-Li County (TW); Ming-Che Chiang, Miao-Li County (TW); Hong-Pin Ko, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 16 days.

(21) Appl. No.: 16/681,846

(22) Filed: Nov. 13, 2019

(65) Prior Publication Data

US 2020/0194537 A1 Jun. 18, 2020

Related U.S. Application Data

(60) Provisional application No. 62/778,297, filed on Dec. 12, 2018.

(30) Foreign Application Priority Data

Jul. 18, 2019 (CN) .......................... 201910649673.2

(51) Int. Cl.
*G09G 3/32* (2016.01)
*H01L 27/15* (2006.01)
(Continued)

(52) U.S. Cl.
CPC .......... *H01L 27/3279* (2013.01); *G09G 3/32* (2013.01); *G09G 3/3258* (2013.01);
(Continued)

(58) Field of Classification Search
CPC . H01L 27/3279; H01L 27/156; H01L 27/124; H05K 2201/0784; G09G 3/32;
(Continued)

(56) References Cited

U.S. PATENT DOCUMENTS

2011/0316838 A1* 12/2011 Ahn .......................... H02J 1/00
345/211
2014/0070709 A1 3/2014 Lee
(Continued)

FOREIGN PATENT DOCUMENTS

CN 101859541 A 10/2010
CN 103927968 7/2014
(Continued)

*Primary Examiner* — Galina G Yushina
(74) *Attorney, Agent, or Firm* — Winston Hsu

(57) ABSTRACT

An electronic device is provided and includes a first voltage trace, a second voltage trace, a first region electrode, a second region electrode, and a voltage source module. The second voltage trace is electrically insulated from the first voltage trace, the first region electrode is electrically connected to the first voltage trace, and the second region electrode is electrically connected to the second voltage trace. The voltage source module provides a first driving voltage to the first voltage trace and provides a second driving voltage to the second voltage trace, in which the first driving voltage is different from the second driving voltage.

9 Claims, 10 Drawing Sheets

(51) Int. Cl.
  *G09G 3/3258* (2016.01)
  *H01L 27/12* (2006.01)
  *H01L 27/32* (2006.01)

(52) U.S. Cl.
  CPC ........ *H01L 27/156* (2013.01); *H01L 27/3211* (2013.01); *G09G 2300/0452* (2013.01); *G09G 2320/0233* (2013.01); *H01L 27/124* (2013.01); *H05K 2201/0784* (2013.01)

(58) Field of Classification Search
  CPC .. G09G 3/3224; G09G 3/3233; G09G 3/3258; G09G 3/3208
  See application file for complete search history.

(56) References Cited

U.S. PATENT DOCUMENTS

| | | | |
|---|---|---|---|
| 2014/0239823 A1* | 8/2014 | Ahn | G09G 3/3233 315/161 |
| 2014/0368416 A1 | 12/2014 | Gu | |
| 2015/0255017 A1* | 9/2015 | Kim | G09G 3/3225 315/172 |
| 2016/0049111 A1 | 2/2016 | Lee | |
| 2016/0300529 A1* | 10/2016 | Minami | G09G 3/3266 |
| 2016/0358545 A1* | 12/2016 | Yin | G09G 3/3258 |

FOREIGN PATENT DOCUMENTS

| | | |
|---|---|---|
| CN | 104050915 A | 9/2014 |
| CN | 107994056 A | 5/2018 |
| JP | H02-181120 A | 7/1990 |

\* cited by examiner

ELECTRONIC DEVICE

CROSS REFERENCE TO RELATED APPLICATION

This application claims the benefit of Chinese Patent Application Serial No. 201910649673.2, filed Jul. 18, 2019 and the benefit of U.S. Provisional Application Ser. No. 62/778,297, filed Dec. 12, 2018, and the entire contents of which are incorporated herein by reference.

BACKGROUND OF THE DISCLOSURE

1. Field of the Disclosure

The present disclosure relates to an electronic device, and more particularly to an electronic device providing different voltages to different region electrodes.

2. Description of the Prior Art

In self-emissive display devices, a light-emitting component in each sub-pixel is directly used to display brightness level (gray level), so the self-emissive display device can have advantages of high contrast, wide viewing angle, short response time and light weight as compared with non-self-emissive display devices, such that the self-emissive display device can replace the non-self-emissive display device in some applications and become mainstream. In the self-emissive display device, since the required image is displayed by controlling the brightness level of each light-emitting component, driving voltage provided to each sub-pixel will affect the brightness of the light-emitting component.

In conventional self-emissive display device, to drive the light-emitting component of each sub-pixel, each sub-pixel is electrically connected to the same voltage source by a corresponding voltage trace. However, with the difference in the distances between the sub-pixels and the voltage source, the equivalent resistances of the voltage traces are different. For this reason, when the voltage source provides the same driving voltage to the voltage traces, the sub-pixels electrically connected to the voltage traces with different equivalent resistances will receive different driving voltages, resulting in inconsistency of image brightness of the display device.

SUMMARY OF DISCLOSURE

Some embodiments of the present disclosure therefore provide an electronic device including a first voltage trace, a second voltage trace, a first region electrode, a second region electrode, and a voltage source module. The second voltage trace is electrically insulated from the first voltage trace, the first region electrode is electrically connected to the first voltage trace, and the second region electrode is electrically connected to the second voltage trace. The voltage source module provides a first driving voltage to the first voltage trace and provides a second driving voltage to the second voltage trace, in which the first driving voltage is different from the second driving voltage.

These and other objectives of the present disclosure will no doubt become obvious to those of ordinary skill in the art after reading the following detailed description of the embodiment that is illustrated in the various figures and drawings.

DETAILED DESCRIPTION

Figure 1:
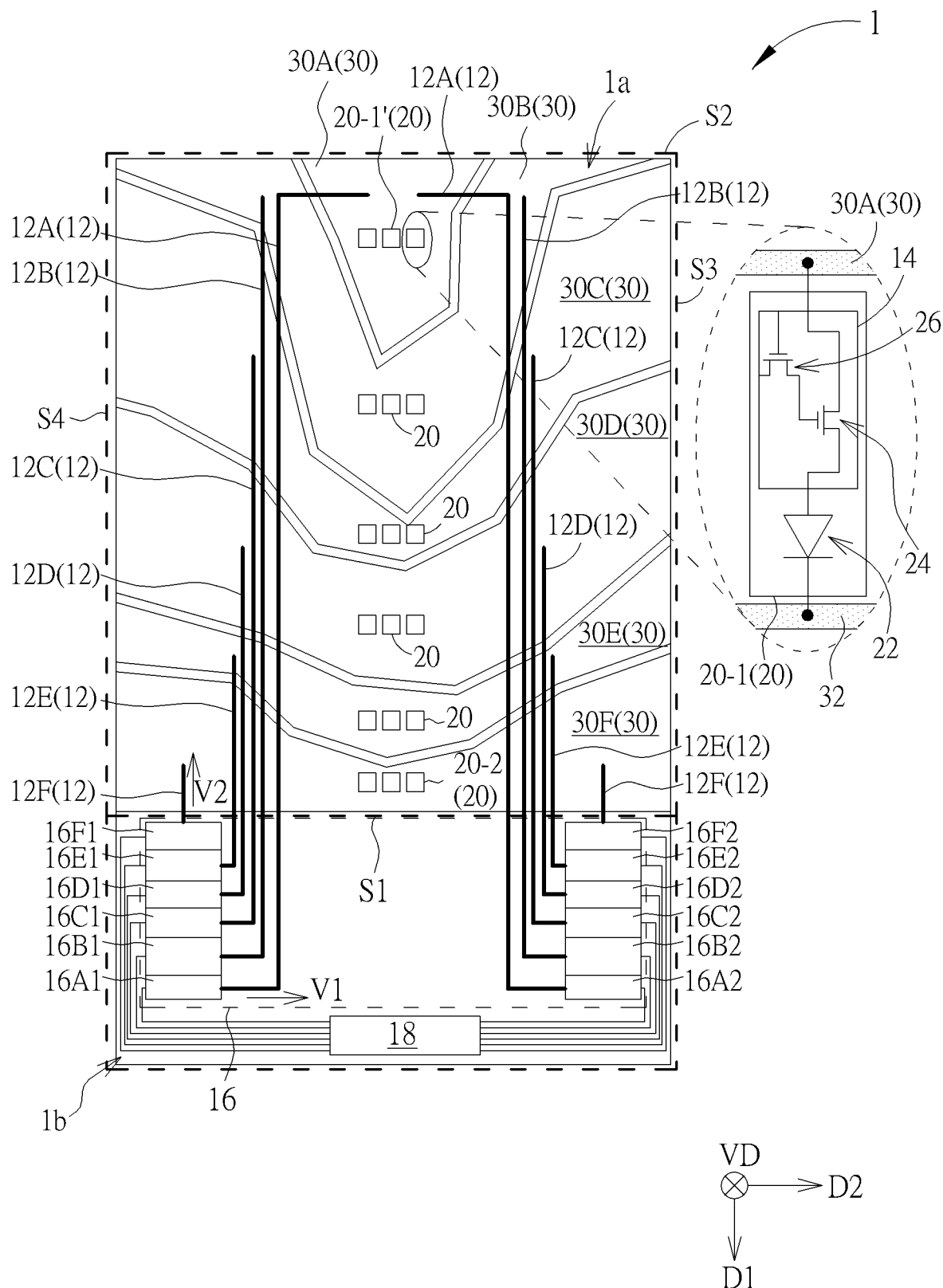
FIG. 1 is a schematic diagram illustrating a top view of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when a component is referred to as being "connected to" another component (or its variant), it can be directly connected to the another component, or connected to the another component through one or more intervening components.

Spatially relative terms, such as "above", "on", "beneath", "below", "under", "left", "right", "before", "front", "after", "behind" and the like, used in the following embodiments only refer to the directions in the drawings and are not intended to limit the present disclosure. It should be understood that the components in the drawings may be disposed in any kind of formation known by one skilled in the related art to describe the components in a certain way. Furthermore, when one layer is "on" another layer or a substrate, it can be "directly on" the another layer or the substrate, or the one layer is on the another layer or the substrate, or another layer may be sandwiched between the one layer and the another layer or the substrate.

In addition, in this specification, relative expressions, such as "lower", "bottom", "upper" or "top", may be used to describe the position of one component relative to another. It is understood that if the device in the figures is turned over, components described as "lower" would then be oriented to be "upper" components.

Although the terms such as first, second, etc. may be used in the description and following claims to describe various components in claims, these terms doesn't mean or represent the claimed components have order and doesn't represent the order of one claimed component and another one claimed component, or the sequence in manufacturing method. These terms are used to discriminate a claimed component with a denomination from another one claimed component with the same denomination.

It should be noted that the technical features in different embodiments described in the following can be replaced, recombined, or mixed with one another to constitute another embodiment without departing from the spirit of the present disclosure.

FIG. 1 is a schematic diagram illustrating a top view of an electronic device according to a first embodiment of the present disclosure. The electronic device 1 includes a plurality of voltage traces 12, a plurality of region electrodes 30, and a voltage source module 16, in which an end of each voltage trace 12 may be individually electrically connected to the voltage source module 16, the other end of each voltage trace 12 may be electrically connected to one corresponding region electrode 30. The voltage traces 12 of this embodiment may be for example divided into voltage traces 12A-12F that are electrically insulated from each other, and the region electrodes 30 may also be for example divided into the region electrodes 30A-30F that are electrically insulated from each other. As an example, the voltage trace 12A is electrically connected to the corresponding region electrode 30A, the voltage trace 12B is electrically connected to the corresponding region electrode 30B, and so on, but the present disclosure is not limited thereto. Since the voltage source module 16 may provide different driving voltages to different voltage traces 12A-12F, each of the region electrodes 30A-30F corresponding to different voltage traces 12A-12F can receive a corresponding driving voltage, such that the driving voltages provided to the region electrodes 30A-30F can be independent of each other. The region electrodes 30A-30F may be electrodes located in different regions and separated from each other. The region electrodes 30A-30F may be for example the region electrodes in descending order of distance from the voltage source module 16. In some embodiments, widths of slits between the adjacent region electrodes 30A-30F are not limited to that shown in FIG. 1.

For example, when equivalent resistances of the voltage traces 12A-12F are not the same, by means of providing different and independent driving voltages to different voltage traces 12A-12F, each of the region electrodes 30A-30F may receive a required driving voltage, for example, the region electrodes 30A-30F may receive the same or approximately the same driving voltage without being affected by different distances from voltage source module 16. As used herein, the term "the same" driving voltage refers to as the driving voltage in a range from 98% of a predetermined value to less than 102% of the predetermined value, and the driving voltage outside the range is regarded as a "different" driving voltage. Taking the voltage traces 12A-12F being respectively electrically connected to the region electrodes 30 in descending order of distance from the voltage source module 16 as an example, the equivalent resistance of the voltage trace 12F closer to the voltage source module 16 is less than the equivalent resistance of the voltage trace 12A farther from the voltage source module 16, and by means of providing the driving voltage to the voltage trace 12A greater than the driving voltage provided to the voltage trace 12F by the voltage source module 16, the driving voltage received by the region electrode 30A corresponding to the voltage trace 12A can be compensated to be approximate to or the same as the driving voltage received by the region electrode 30F corresponding to the voltage trace 12F. For the same reason, the region electrodes 30B-30E respectively corresponding to the voltage traces 12B-12E may receive the same or approximate driving voltage. Therefore, no matter what distance between the region electrodes 30A-30F and the voltage source module 16 is, the region electrodes 30A-30F can receive the same driving voltage. In this embodiment, the driving voltages provided to the voltage traces 12A-12F by the voltage source module 16 may be for example a DC voltage, but not limited thereto.

The voltage source module 16 may optionally have a plurality of voltage output terminals 16A1-16F1, and the voltage output terminal 16A1-16F1 are respectively electrically connected to the corresponding voltage traces 12A-12F for providing a plurality of independent and different driving voltages. In this embodiment, the voltage source module 16 may be a single voltage source that is controlled and outputted by single one control device 18, but is not limited thereto. In some embodiments, the voltage source module 16 may include at least two voltage source that are controlled and outputted by one or two or more control devices 18. In some embodiments, the control device may be for example an integrated circuit.

The electronic device may include a display device, an antenna device, a sensing device, a tiled device or other suitable non-display device. The antenna device may be for example a liquid crystal antenna, but is not limited thereto. The tiled device may be for example a tiled display device or a tiled antenna device, but is not limited thereto. It is noted that the electronic device may be any combination of the above-mentioned, but is not limited thereto. The following electronic device 1 being the display device is taken as an example for detailing the content of the present disclosure, but the present disclosure is not limited thereto. In some embodiments, a top-view shape of the electronic device 1 is not limited to be rectangular and may be other geometric shapes.

As shown in FIG. 1, the electronic device 1 of this embodiment may have a display region 1a and a peripheral region 1b outside the display region 1a, but not limited thereto. In this embodiment, the peripheral region 1b is disposed on a side S1 of the display region 1a facing a first direction D1. In some embodiments, the peripheral region 1b may be disposed on a side of the display region 1a facing a direction different from the first direction D1, but not limited thereto. The electronic device 1 may include a plurality of sub-pixels 20 disposed in the display region 1a and for displaying images. For clarity, an enlarged diagram at right part of FIG. 1 exemplifies one of the sub-pixels 20, but the present disclosure is not limited thereto. The region electrodes 30A-30F are respectively disposed in different regions of the display region 1a and used for electrically connecting the sub-pixels 20 in different regions to different voltage traces 12A-12F. At least one sub-pixel 20 may be disposed in each region, i.e. each of the region electrodes 30A-30F may correspond to and be electrically connected to at least one sub-pixel 20. In this embodiment, each of the region electrodes 30A-30F may correspond to plural sub-pixels 20, for example, a whole of plural red sub-pixels, plural blue sub-pixels and plural green sub-pixels corresponding to the same one of the region electrode 30A-30F may be electrically connected to the one of the region electrode 30A-30F. In other words, the sub-pixels 20 electrically connected to one of the region electrodes 30A-30F may receive a driving voltage from the corresponding one of the voltage trace 12A-12F. For example, the sub-pixel 20-1 and the sub-pixel 20-1' may be electrically connected to the same voltage trace 12A and receive the same driving voltage.

Taking a self-emissive display device as an example, each sub-pixel 20 may include a light-emitting unit 22 for generating a brightness of a required gray level of the sub-pixel. In some embodiments, the light-emitting unit 22 may include organic light-emitting diode or inorganic light-emitting diode (such as quantum dot light-emitting diode (such as QLED or QDLED), mini-LED, Micro-LED). The light-emitting unit 22 may optionally include fluorescent material, phosphor material or other suitable material or any combination thereof, but not limited thereto. In this embodiment, three sub-pixels 20 capable of generating light of different colors may form a pixel PX, but not limited thereto. In some embodiments, the formation of the pixel PX may be determined according to arrangement of the sub-pixels 22, such as array arrangement, PenTile arrangement, or other suitable arrangement.

In some embodiments, each sub-pixel 20 may further include a circuit 14 for electrically connecting a corresponding one of the region electrodes 30A-30F to the light-emitting unit 22 so as to driving the light-emitting unit 22. For example, the circuit 14 may include a driving transistor 24 and a switch transistor 26, in which the driving transistor 24 is for controlling brightness of the light-emitting unit 22, a source(drain) electrode of the driving transistor 24 is electrically connected to an anode of the light-emitting unit 22, and a drain(source) electrode of the driving transistor 24 is electrically connected to the voltage source module 16. The switch transistor 26 is for controlling switch of the driving transistor 24, and a drain(source) electrode is electrically connected to a gate electrode of the driving transistor 24, but the present disclosure is not limited thereto. Furthermore, the electronic device 1 may further include a plurality of scan lines and a plurality of data lines for transferring signals for controlling the circuit 14. One of the scan lines is electrically connected to a gate electrode of one corresponding switch transistor 26, and one of the data lines is electrically connected to the a source(drain) of one corresponding switch transistor 26. In some embodiments, the circuit 14 may not include the switch transistor 26, and the gate electrode of the driving transistor 24 is electrically connected to the corresponding data line. For clearly illustrating the electronic device 1 of this embodiment, FIG. 1 ignores the scan lines and the data lines, but not limited thereto. The circuit 14 of the present disclosure is not limited to that as shown in FIG. 1, and in some embodiments, the circuit 14 may further include other transistor, or the transistors in the circuit 14 may have other connection mode. In some embodiments, light-emitting units 22 may be light-emitting diode package capable of generating light of different colors that are electrically connected to three circuits 14 respectively, but not limited thereto. In some embodiments, each sub-pixel 20 may further include a pixel electrode (not shown in figures) for electrically connecting the circuit 14 to the light-emitting unit 22. In some embodiments, the pixel electrode may be for example the anode or cathode of the light-emitting unit 22 or other suitable electrode. It is noted that the region electrode 30 is used for electrically connecting the circuit 14 to the voltage trace 12 and is different from the pixel electrode that is electrically connected between the circuit 14 and the light-emitting unit 22.

In some embodiments, the electronic device 1 may further include driving components or circuits for driving the sub-pixels and traces disposed in the peripheral region 1b. In some embodiments, the driving components, traces and the voltage source module 16 in the peripheral region 1b may be bent toward back side of the display device (i.e. the back surface without displaying images), so as to improve a screen-to-body ratio of the display device.

In this embodiment, the region electrodes 30A-30F may be located within the regions in the display region 1a in the descending order of distance from the voltage source module 16, for example, the region electrodes 30A-30F are sequentially arranged along the first direction D1 from a side S2 to the side S1 of the display region 1a, but not limited thereto. The arranging direction of the region electrodes 30A-30F may be a second direction D2 or a direction different from the first direction D1 and the second direction D2. The voltage traces 12A-12F of this embodiment individually extend from the peripheral region 1b to the display region 1a and are electrically connected to different region electrodes 30A-30F respectively. When one of the region electrodes 30 is not the electrode closest to the peripheral region 1b, the voltage trace 12 electrically connected to the farther region electrode 30 may cross and be electrically insulated from other region electrode 12, for example, the voltage trace 12A may cross the region electrodes 30B-30F that are not electrically connected to the voltage trace 12A. Hence, lengths of the voltage traces 12A-12F extending to different region electrodes 30A-30F may be different, resulting in difference between the equivalent resistances of the voltage traces 12A-12F.

Based on formula (1): $R=P \times L/(W \times H)$, the equivalent resistances of the voltage traces 12A-12F may be calculated, where R is an equivalent resistance of a corresponding one of the voltage traces 12A-12F, P is resistivity of a corresponding one of the voltage traces 12A-12F, L is a length of the corresponding one of the voltage traces 12A-12F, such as an extending length of the corresponding one of the voltage traces 12A-12F measured when the voltage traces 12A-12F have the same sectional area in a top-view direction VD, W is a line width of the corresponding one of the voltage traces 12A-12F, such as a sectional width of the corresponding one of the voltage traces 12A-12F measured along a direction perpendicular to the extending direction and parallel to a horizontal direction, and H is a line height of the corresponding one of the voltage traces 12A-12F, such as a sectional height of the corresponding one of the voltage traces 12A-12F measured along the top-view direction VD. The horizontal direction may be for example the first direction D1, the second direction D2 or a direction parallel to a plane formed by the first direction D1 and the second direction D2. For example, when the voltage traces 12A-12F have the same sheet resistance, i.e. the voltage traces 12A-12F have the same resistivity, the same line height and the same line width, the voltage traces 12A-12F will have different equivalent resistances that are sequentially decreased, but not limited thereto. It is noted that, by means of providing different driving voltages to different voltage traces 12A-12F by the voltage source module 16, for example, providing the driving voltages from high to low in order to the voltage traces 12A-12F with equivalent resistances from high to low in sequence, the driving voltage received by the sub-pixel 20, such as the sub-pixel 20-1 or 20-1', farther from the voltage source module 16 is appropriately compensated to be the same as or approximately the same as the driving voltage received by the sub-pixel 20, such as the sub-pixel 20-2, closer to the voltage source module 16, thereby mitigating the issue of different driving voltages received by the sub-pixels 20 due to different distances between the sub-pixels 20 and the voltage source module 16. Accordingly, the electronic device 1 may achieve uniform brightness.

It is noted that in this embodiment, since the sub-pixel 20-1 electrically connected to the region electrode 30A is farther from the voltage source module 16 than the sub-pixel 20-2 electrically connected to the region electrode 30F, the voltage trace 12A electrically connected from the voltage source module 16 to the sub-pixel 20-1 is longer than the voltage trace 12F electrically connected from the voltage source module 16 to the sub-pixel 20-2. When the voltage traces 12A, 12F have the same sheet resistance, the equivalent resistance of the voltage trace 12A is greater than the equivalent resistance of the voltage trace 12F. As an example, the voltage source module 16 may provide a voltage V1 to the voltage trace 12A and provide a voltage V2 to the voltage trace 12F, in which the voltage V1 is greater than the voltage V2. Because the equivalent resistance of the voltage trace 12A is greater than the equivalent resistance of the voltage trace 12F, the same voltage finally received by the sub-pixels 20 electrically connected to the region electrode 30A and the region electrode 30F. For example, when all the sub-pixels 20 of the electronic device 1 is predetermined to receive a voltage, such as 7V, the voltage V1 and the voltage V2 provided by the voltage source module 16 may be 9.0V and 7.5V, but not limited thereto. Through providing different driving voltages V1, V2 to the voltage trace 12A and the voltage trace 12F, the final voltage received by the sub-pixel 20-1 and the sub-pixel 20-2 can be substantially the same, and uniformity of image brightness of the display device may be increased accordingly.

In this embodiment, the number of the voltage traces 12A-12F extending from the peripheral region 1b to the same one of the region electrodes 30A-30F may be two, but not limited thereto. For example, the electronic device 1 includes two voltage traces 12A electrically connected to the sub-pixels 20 of the same one region electrode 30A, and so forth. In such situation, the voltage source module 16 may further have a plurality of voltage output terminals 16A2-16F2, and the voltage output terminals electrically connected to the same one of the region electrodes 30A-30F provide the same driving voltage. In this embodiment, each of the voltage output terminals 16A2-16F2 provide the same driving voltage as that provided by a corresponding one of the voltage output terminals 16A1-16F1. In some embodiments, the number of the voltage trace of the voltage traces 12A-12F electrically connected to one of the region electrodes 30A-30F may be one or two or more. In this embodiment, the voltage traces 12A-12F may respectively extend to two sides (right side and left side) of the region electrodes 30A-30F. In other embodiments, the voltage traces 12A-12F may be disposed on the same side of the region electrodes 30A-30F, but not limited thereto. It is noted that, in this embodiment, the region electrodes 30A far from the peripheral region 1b is not in contact with two sides S3, S4 of the display region 1a arranged in the second direction D2, and the region electrodes 30B-30F between the region electrode 30A and the peripheral region 1b may have concave side facing the peripheral region 1b, but the present disclosure is not limited thereto. The size (i.e. the number of the sub-pixel corresponding to one of the region electrodes 30A-30F) and shape of one of the region electrodes 30A-30F may be determined according to the required display device. In some embodiments, the sizes of the region electrodes 30A-30F are determined based on whether the brightness of the sub-pixels 20 in the same one of the region electrode 30A-30F can be recognized by human eyes, but not limited thereto.

The region electrodes 30 shown in left portion of FIG. 1 are exemplified and are not shown as real shape. As shown in the enlarged diagram in right portion of FIG. 1, the region electrodes 30 may for example include a plurality of strip electrodes, but not limited thereto. In some embodiments, the voltage traces 12A-12F may not extend into the display region 1a, but the region electrodes 30 extend to the outside of the display region 1a to be electrically connected to the voltage traces 12A-12F. In this embodiment, the electronic device 1 may further include a common voltage line 32 electrically connected to the cathodes of the light-emitting units 22 of all the sub-pixels 20.

The electronic device of the present disclosure is not limited to the above embodiment, and other embodiments may exist. For simplicity, same components of other embodiments would be labeled with the same symbols of the first embodiment in the following description. To compare the embodiments conveniently, the following description will detail the dissimilarities among different embodiments and the identical features will not be redundantly described.

Figure 2:
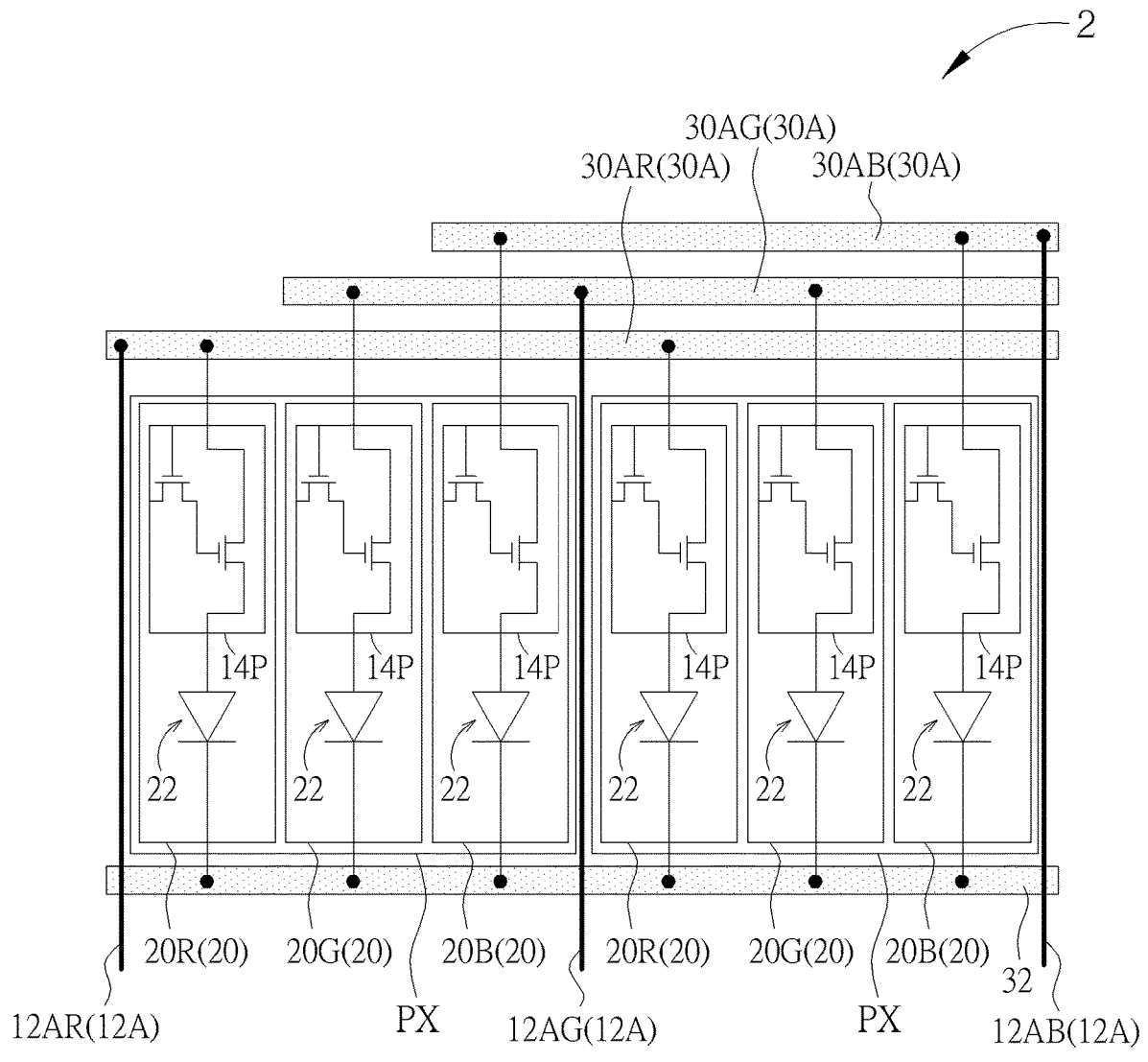
FIG. 2 is a schematic diagram illustrating a top view of apart of sub-pixels, a part of region electrodes and a part of voltage traces of an electronic device according to a second embodiment of the present disclosure.
Figure 2:
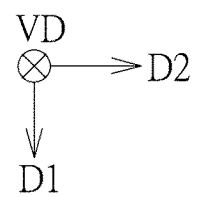

FIG. 2 is a schematic diagram illustrating atop view of a part of sub-pixels, a part of region electrodes and a part of voltage traces of an electronic device according to a second embodiment of the present disclosure. For clarity, FIG. 2 only shows a part of the region electrodes, a part of the sub-pixels and a part of the voltage traces and ignores the voltage source module, but not limited thereto. A different between the electronic device 2 provided in this embodiment and the first embodiment shown in FIG. 1 is that the sub-pixels 20 electrically connected to the same one of the region electrodes 30A-30F and corresponding to different colors may be electrically connected to different voltage traces. Taking the region electrode 30A as an example, the sub-pixels 20 may be divided into a plurality of sub-pixels 20R, a plurality of sub-pixels 20G, and a plurality of sub-pixels 20B, in which the light-emitting units 22 of the sub-pixels 20R, the light-emitting units 22 of the sub-pixel 20G and the light-emitting units 22 of the sub-pixel 20B may generate light of different colors, such as red, green and blue respectively, but not limited thereto. The region electrode 30A may include a region electrode 30AR, a region electrode 30AG, and a region electrode 30AB that are electrically insulated from each other. The region electrodes 30AR, 30AG, 30AB are electrically connected to the sub-pixels 20R, the sub-pixels 20G and the sub-pixels 20B respectively. In addition, the voltage trace 12A extending to the region electrode 30A may include a voltage trace 12AR, a voltage trace 12AG, and a voltage trace 12AB that are electrically insulated from each other, in which the voltage trace 12AR, the voltage trace 12AG, and the voltage trace 12AB are electrically connected to the region electrodes 30AR, 30AG, 30AB respectively. For this reason, the sub-pixels 20R, the sub-pixels 20G, and the sub-pixels 20B may be electrically connected to the voltage source module through the voltage trace 12AR, the voltage trace 12AG and the voltage trace 12AB respectively. That is to say that the sub-pixels 20R, the sub-pixels 20G and the sub-pixels 20B located in the same region (corresponding to the same region electrode 30A) may receive individual driving voltages respectively. For example, voltage output terminal of the voltage source module electrically connected to the voltage trace 12A may include three voltage output terminals electrically connected to the voltage trace 12AR, the voltage trace 12AG and the voltage trace 12AB respectively. In some embodiments, the voltage trace 12A receiving the same one driving voltage may extend into a region corresponding to the region electrode 30A and be electrically connected to the voltage traces 12AR, 12AG, 12AB through corresponding circuits (not shown), such that the driving voltages may be divided into three driving voltages through the corresponding circuits (not shown), and the three driving voltages are provided to the voltage traces 12AR, 12AG, 12AB respectively. Accordingly, the sub-pixels 20R, the sub-pixels 20G and the sub-pixels 20B may receive different driving voltages. When the light-emitting units 22 of the sub-pixels 20R, the light-emitting units 22 of the sub-pixels 20G and the light-emitting units 22 of the sub-pixels 20B need different driving voltages, the arrangement of this embodiment can facilitate the sub-pixels 20R, 20G, 20B of different colors to be driven separately, thereby improving image quality of the display device. In some embodiments, structures of other region electrodes may be the same as the structure of the region electrode 30A.

Figure 3:
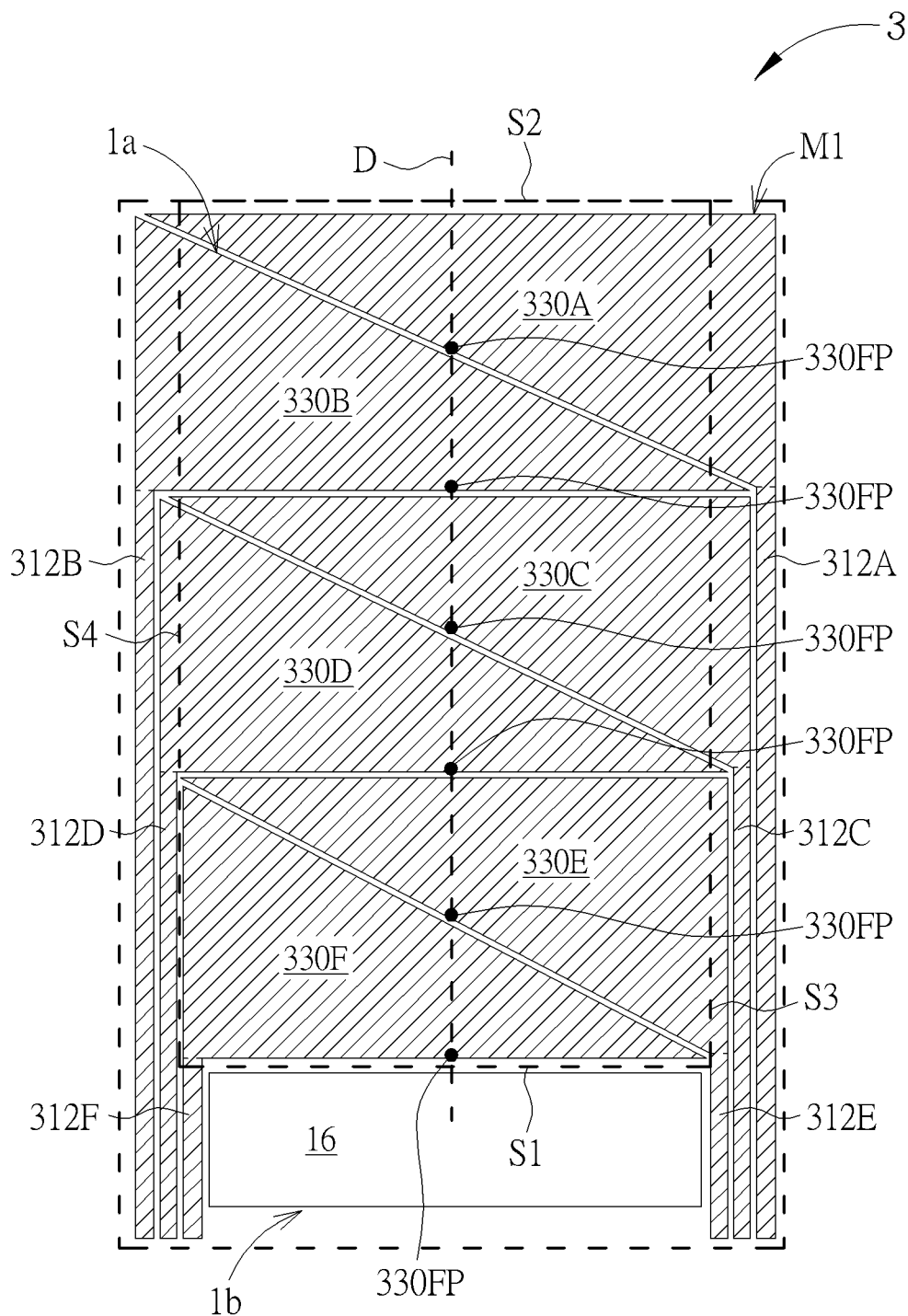
FIG. 3 is a schematic diagram illustrating a top view of an electronic device according to a third embodiment of the present disclosure.
Figure 3:
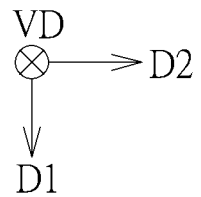

FIG. 3 is a schematic diagram illustrating a top view of an electronic device according to a third embodiment of the present disclosure. For clarity, FIG. 3 shows only the voltage traces and the region electrodes, but not limited thereto. The voltage traces 312A-312F and the region electrodes 330A-330F of the electronic device 3 provided in this embodiment may be formed of the same conductive layer M1. A difference between this embodiment and the above embodiment is that the voltage traces 312A-312F are located in the peripheral region 1b. In this embodiment, at least one of the voltage traces 312A-312F may extend along surrounding of the display region 1a to the corresponding one of the region electrodes 330A-330F, for example, the voltage traces 312B, 312D extend along the side S4 to the corresponding region electrodes 330B, 330D. And the region electrodes 330E, 330F close to the voltage source module (not shown) are electrically connected to the voltage traces 312E, 312F on the side S1. Furthermore, different from the above embodiment, the areas of different region electrodes 330A-330F may be equal, and shapes of different region electrodes 330A-330F are not limited to that shown in FIG. 3 and may be other shapes. In this embodiment, the same one of the region electrodes 330A-330F is left-right asymmetrical, for example, the width of the region electrode 330A in the first direction D1 gradually increases along the second direction D2, and the region electrode 330A is electrically connected to the voltage trace 312A on the side S3 of the display region 1a; and the width of the adjacent region electrode 330B in the first direction D1 gradually increases along a direction opposite to the second direction D2, and the adjacent region electrode 330B is electrically connected to the voltage trace 312B on the side S4 of the display region 1a. Other region electrodes 330C, 330D may be varied based on the region electrode 330A and the adjacent region electrode 330B, but not limited thereto. In some embodiments, the conductive layer M1 may include metal or other suitable material. In some embodiments, the voltage traces 312A-312F and the region electrodes 330A-330F may be formed of different conductive layers but have the same arrangement as the third embodiment, in which different conductive layers may include the same material or different materials.

In addition, in this embodiment, when the voltage source module 16 is close to the side S1, a reference line D is drawn through a center of the side S1 and along the first direction D1 so as to extend across the region electrodes 330A-330F, and the reference points 330FP closest to the side S1 can be respectively found at the intersections of the reference points 330FP and the reference line D. The reference points 330FP are used to determine the distance between each of the region electrodes 330A-330F and the voltage source module 16, and the voltage source module 16 may provide the corresponding driving voltages according to the distances.

Figure 4:
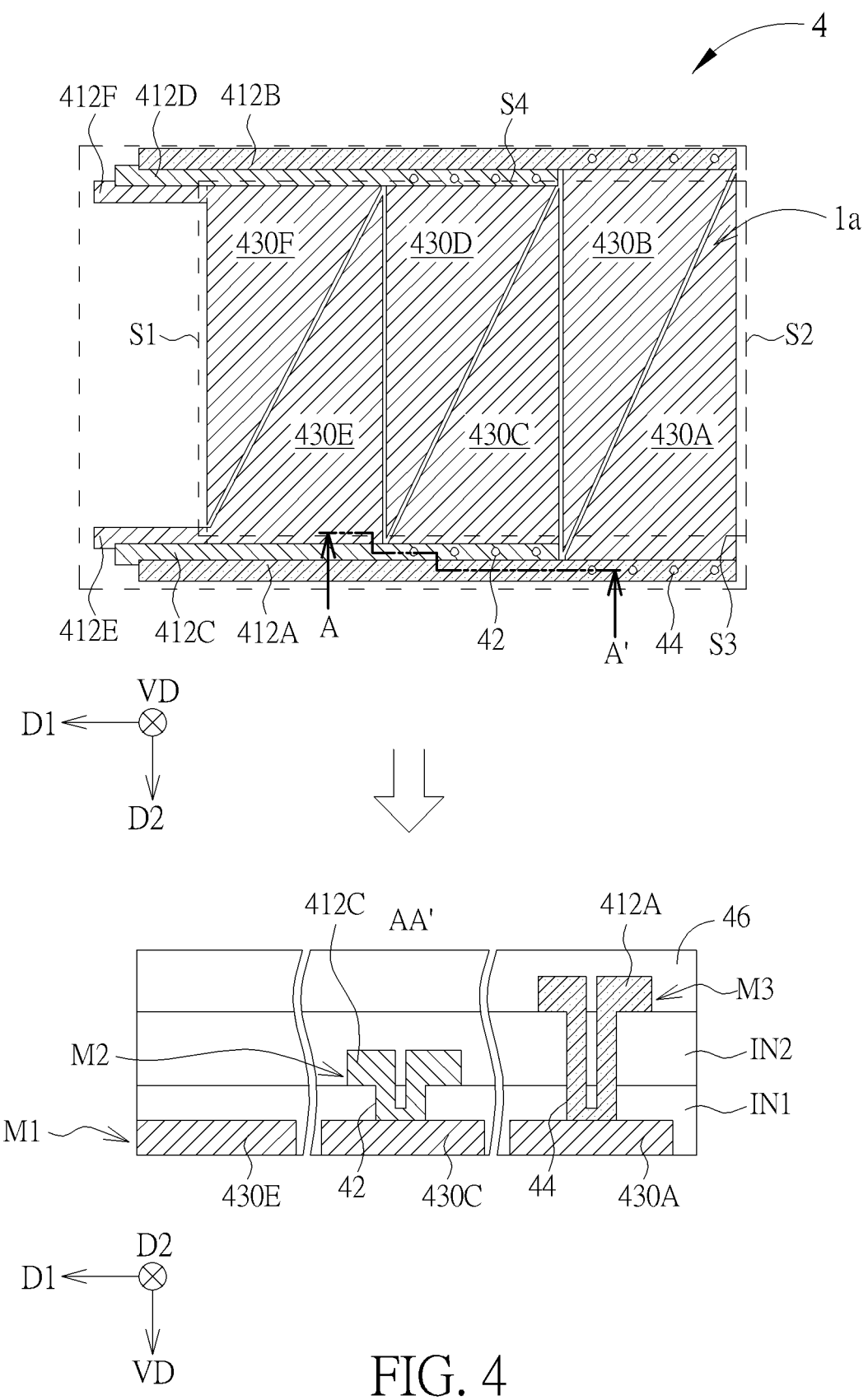
FIG. 4 is a schematic diagram illustrating a sectional view and a top view of an electronic device according to a fourth embodiment of the present disclosure.

FIG. 4 is a schematic diagram illustrating a sectional view and a top view of an electronic device according to a fourth embodiment of the present disclosure, in which a bottom portion of FIG. 4 schematically illustrates a sectional view of a top portion of FIG. 4 taken along a sectional line A-A'. For clarity, FIG. 4 shows only the voltage traces and the region electrodes, but not limited thereto. A difference of the electronic device 4 provided in this embodiment and the third embodiment shown in FIG. 3 is that one of the voltage traces 412A-412F may at least partially overlap another one of the voltage traces 412A-412F in the top-view direction VD in this embodiment. Specifically, at least two of the voltage traces 412A-412F overlapping each other in the top-view direction VD may be formed of different conductive layers. For example, the region electrodes 430A-430F and the voltage traces 412E, 412F may be formed of a conductive layer M1, the voltage traces 412C, 412D may be formed of a conductive layer M2 on the conductive layer M1, and the voltage traces 412A, 412B may be formed of a conductive layer M3 on the conductive layer M2. Also, an insulating layer IN1 is disposed between the conductive layer M1 and the conductive layer M2, and an insulating layer IN2 is disposed between the conductive layer M2 and the conductive layer M3. In some embodiments, the voltage traces 412A, 412B may be formed of the conductive layer M2, and the voltage traces 412C, 412D may be formed of the conductive layer M3. In some embodiments, the region electrodes 430A-430F may be formed of one of the conductive layer M2 and the conductive layer M3, the voltage traces 412C, 412D may be formed of another one of the conductive layer M1, the conductive layer M2 and the conductive layer M3 different from the conductive layer forming the region electrodes 430A-430F and the voltage traces 412E, 412F, and the voltage traces 412A, 412B may be formed of another one of the conductive layer M1, the conductive layer M2 and the conductive layer M3 different from the conductive layers forming the region electrodes 430A-430F and the voltage traces 412C, 412D, 412E, 412F.

The insulating layer IN1 may have a plurality of contact holes 42, such that the voltage traces 412C, 412D may be electrically connected to the corresponding regions electrode 430C, 430D through the contact holes 42 respectively, and the insulating layer IN1 and the insulating layer IN2 may have a plurality of contact holes 44, such that the voltage traces 412A, 412B may be electrically connected to the corresponding region electrodes 430A, 430B through the contact holes 44 respectively. By means of the overlap of the voltage traces 412A-412F, the area of the peripheral region 1b located outside the display region 1a can be shrunk, thereby reduce border width of the electronic device 4. In some embodiments, the electronic device 4 may further include a passivation layer 46 disposed on the insulating layer IN2 and the conductive layer M3.

Figure 5:
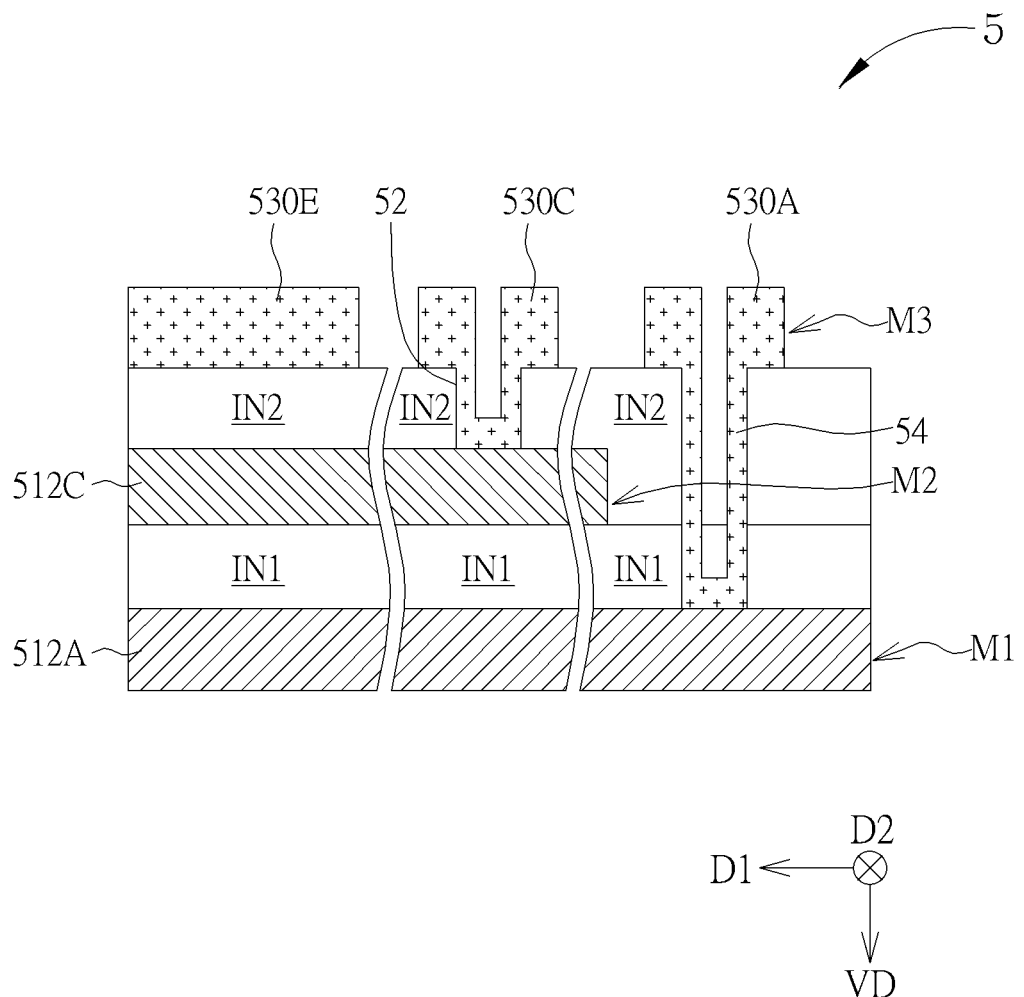
FIG. 5 is a schematic diagram illustrating a sectional view of an electronic device according to a fifth embodiment of the present disclosure.

FIG. 5 is a schematic diagram illustrating a sectional view of an electronic device according to a fifth embodiment of the present disclosure, in which for clarity, FIG. 5 ignore the passivation, but not limited thereto. A difference between the electronic device 5 provided in this embodiment and the fourth embodiment shown in FIG. 4 is that the voltage trace 512A may be formed of the conductive layer M1, and the region electrodes 530A, 530C, 530E may be formed of the conductive layer M3 in this embodiment, so the region electrode 530C extends into the contact hole 52 of the insulating layer IN2 to be connected to the voltage trace 512C, and the region electrode 530A extends into the contact hole 54 of the insulating layer IN1 and the insulating layer IN2 to be connected to the voltage trace 512A. In some embodiments, other voltage traces and other the region electrodes may have the same structure as the region electrode 530A and the voltage trace 512A or the region electrode 530C and the voltage trace 512C and will not be redundantly detailed.

Figure 6:
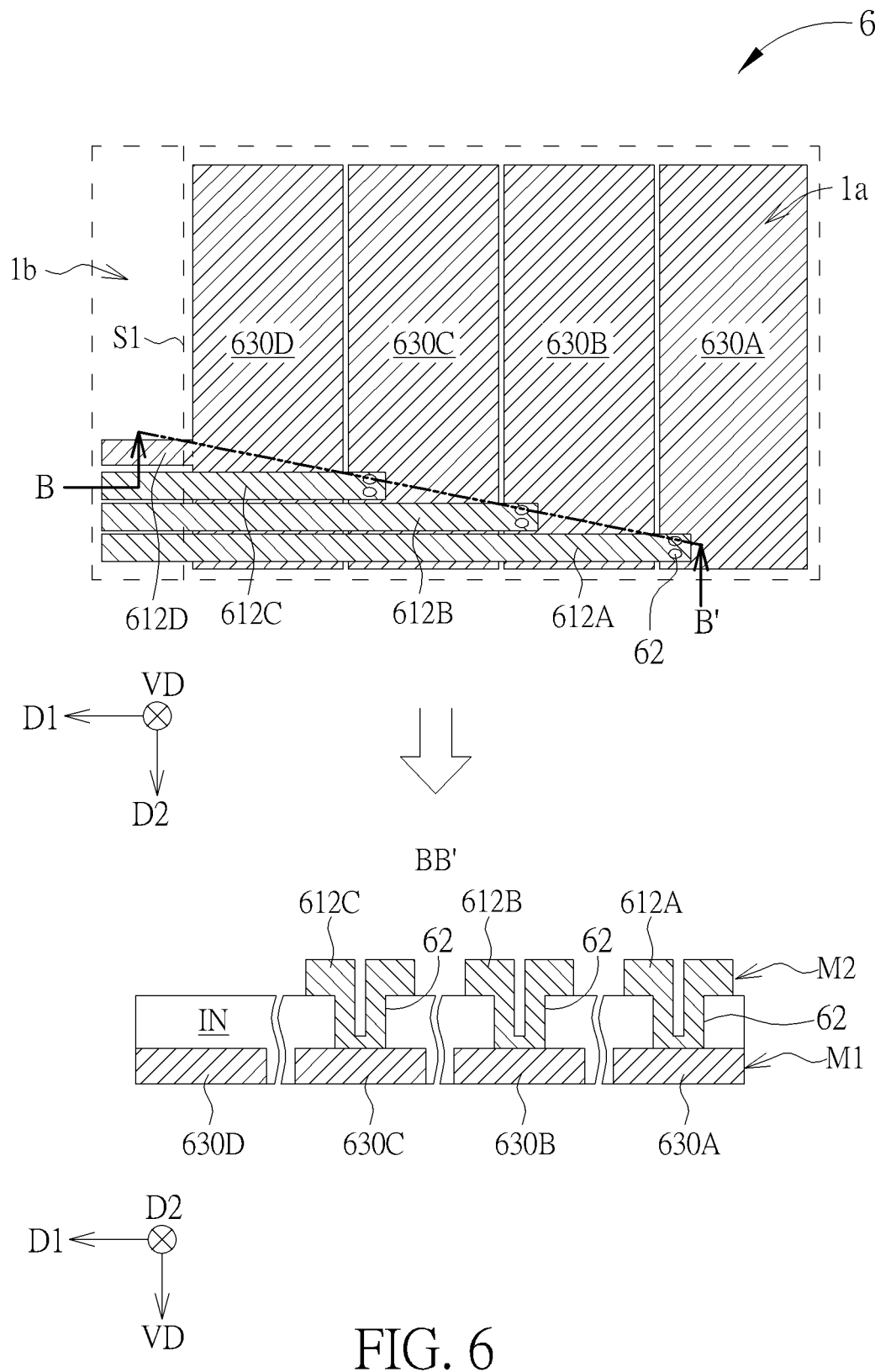
FIG. 6 is a schematic diagram illustrating a top view and a sectional view of an electronic device according to a sixth embodiment of the present disclosure.

FIG. 6 is a schematic diagram illustrating a top view and a sectional view of an electronic device according to a sixth embodiment of the present disclosure, in which a bottom portion of FIG. 6 schematically illustrates a sectional view of a top portion of FIG. 6 taken along a sectional line B-B'. For clarity, FIG. 6 shows four voltage traces and four region electrodes, but the number of the voltage traces and the number of the region electrodes of the present disclosure are not limited thereto. Also, FIG. 6 ignores the passivation layer, but not limited thereto. A difference between the electronic device 6 and the third embodiment shown in FIG. 3 is that at least one of the voltage trace 612A-612D of this embodiment may overlap the display region 1a in the top-view direction VD. Specifically, the region electrodes 630A-630D may be formed of the same conductive layer M1, the voltage traces 612A-612C that are not electrically connected to the region electrode 630D may be formed of the same conductive layer M2, and the voltage trace 612D electrically connected to the region electrode 630D may be formed of the conductive layer M1, but not limited thereto. In this embodiment, since the voltage traces 612A-612C are formed of the same conductive layer M2, the voltage traces 612A-612C may overlap the display region 1a in the top-view direction VD and be separated from each other, which means different voltage traces 612A-612C doesn't overlap each other. In addition, an insulating layer IN is disposed between the conductive layer M1 and the conductive layer M2 and has plural contact holes 62, such that each of the voltage traces 612A-612C may extend into corresponding one of the contact holes 62 to be electrically connected to the corresponding one of the region electrodes 630A-630C. Furthermore, the voltage trace 612D may be directly connected to the region electrode 630D. In some embodiments, the voltage trace 612D may overlap the display region 1a and be formed of the conductive layer M2.

Figure 7:
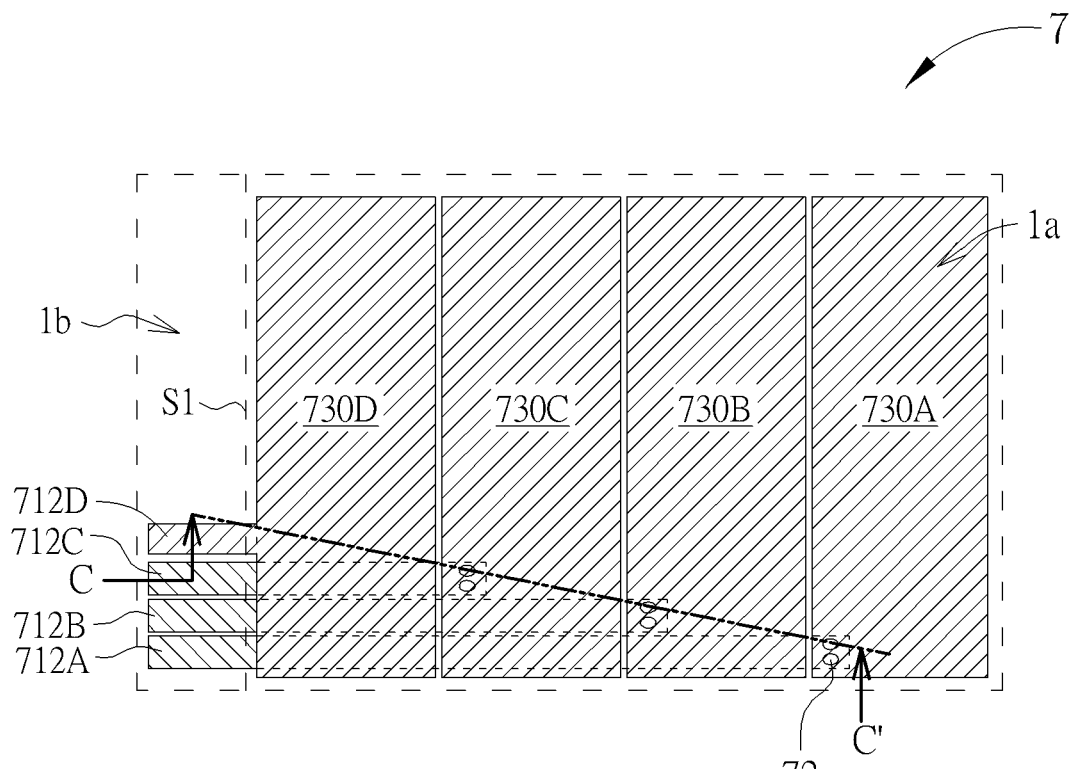
FIG. 7 is a schematic diagram illustrating a top view and a sectional view of an electronic device according to a seventh embodiment of the present disclosure.
Figure 7:
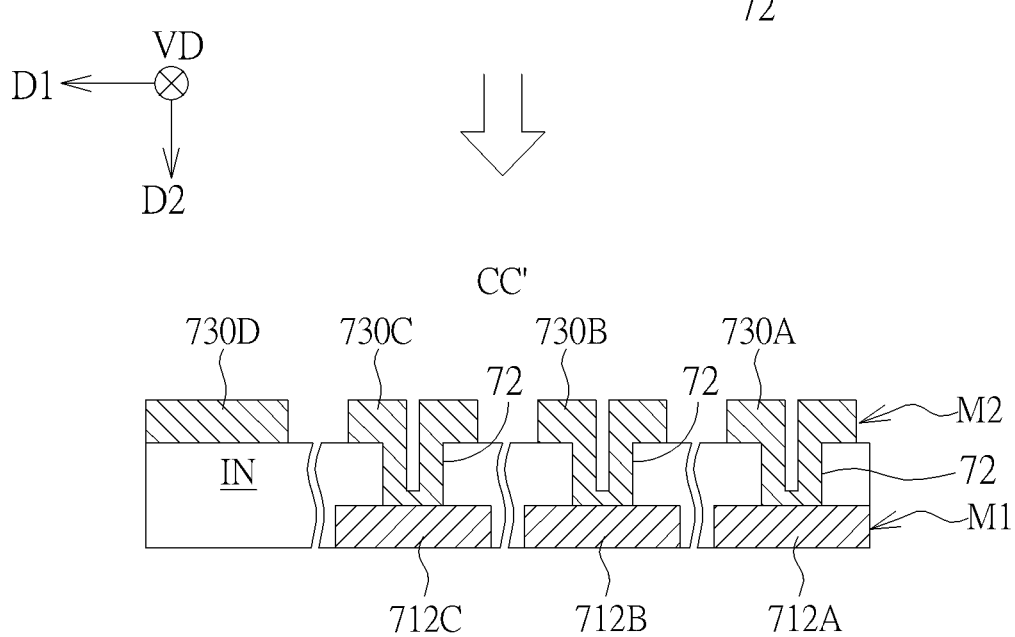

FIG. 7 is a schematic diagram illustrating a top view and a sectional view of an electronic device according to a seventh embodiment of the present disclosure, in which a bottom portion of FIG. 7 schematically illustrates a sectional view of a top portion of FIG. 7 taken along a sectional line C-C'. For clarity, FIG. 7 shows only the voltage traces and the region electrodes and ignores the passivation layer, but not limited thereto. A difference between the electronic device 7 provided in this embodiment and the sixth embodiment shown in FIG. 6 is that the region electrodes 730A-730D and the voltage trace 712D are formed of the conductive layer M2, and the voltage traces 712A-712C are formed of the conductive layer M1 in this embodiment. For this reason, the voltage traces 712A-712C of this embodiment extend into corresponding one of the contact holes 72 respectively to be electrically connected to corresponding one of the region electrodes 730A-730C. In some embodiments, the voltage trace 712D may overlap the display region 1a and be formed of the conductive layer M1.

Figure 8:
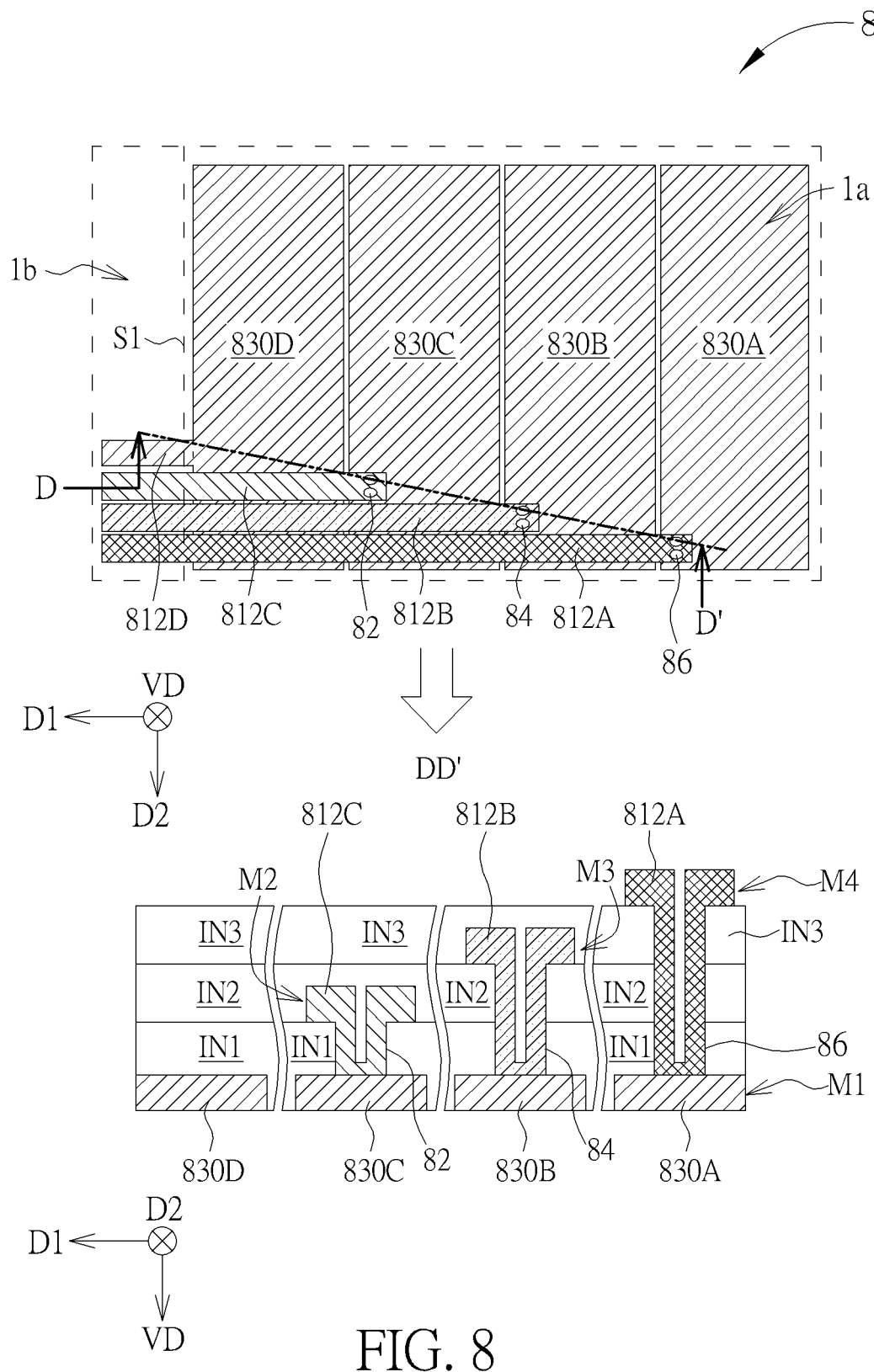
FIG. 8 is a schematic diagram illustrating a top view and a sectional view of an electronic device according to an eighth embodiment of the present disclosure.

FIG. 8 is a schematic diagram illustrating a top view and a sectional view of an electronic device according to an eighth embodiment of the present disclosure, in which a bottom portion of FIG. 8 schematically illustrates a sectional view of a top portion of FIG. 8 taken along a sectional line D-D'. For clarity, FIG. 8 shows only the voltage traces and the region electrodes and ignores the passivation layer, but not limited thereto. A difference between the electronic device 8 provided in this embodiment and the sixth embodiment shown in FIG. 6 is that the voltage traces 812A-812C are formed of different conductive layers in this embodiment. For example, the region electrodes 830A-830D and the voltage trace 812D may be formed of the same conductive layer M1, the voltage trace 812C may be formed of the conductive layer M2, the voltage trace 812B may be formed of the conductive layer M3, and the voltage trace 812A may be formed of the conductive layer M4. Hence, the voltage trace 812D may be directly connected to the region electrode 830D, the voltage trace 812C may be electrically connected to the region electrode 830C through the contact hole 82 of the insulating layer IN1, the voltage trace 812B may be electrically connected to the region electrode 830B through the contact hole 84 of the insulating layer IN1 and the insulating layer IN2, and the voltage trace 812A may be electrically connected to the region electrode 830A through the contact hole 86 of the insulating layer IN1, the insulating layer IN2 and the insulating layer IN3.

Figure 9:
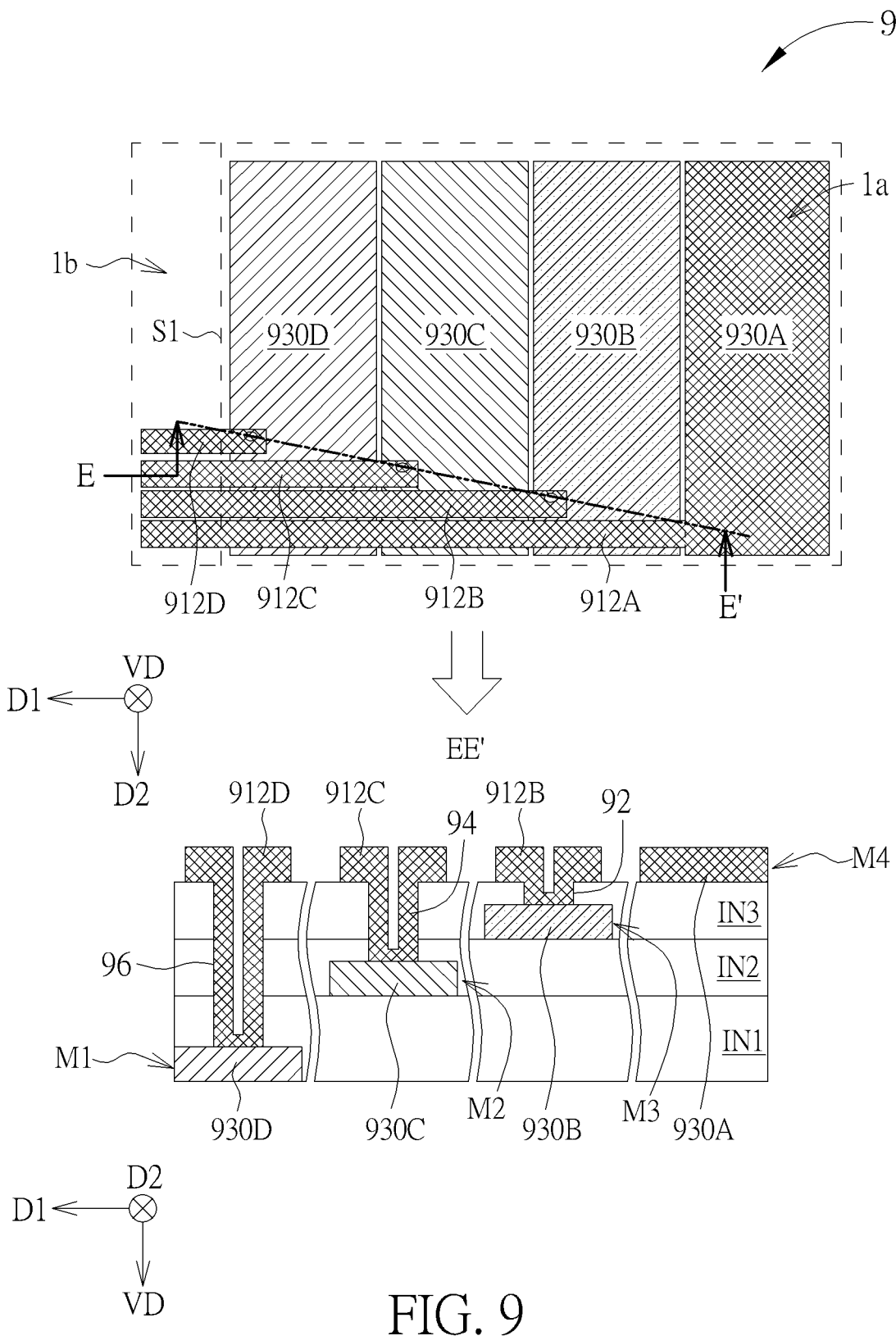
FIG. 9 is a schematic diagram illustrating a top view and a sectional view of an electronic device according to a ninth embodiment of the present disclosure.

FIG. 9 is a schematic diagram illustrating a top view and a sectional view of an electronic device according to a ninth embodiment of the present disclosure, in which a bottom portion of FIG. 9 schematically illustrates a sectional view of a top portion of FIG. 9 taken along a sectional line E-E'. For clarity, FIG. 9 shows only the voltage traces and the region electrodes and ignores the passivation layer, but not limited thereto. A difference between the electronic device 9 provided in this embodiment and the eighth embodiment shown in FIG. 8 is that the region electrodes 930A-930D are formed of different conductive layers, and the voltage trace 912A-912D are formed of the same conductive in this embodiment. For example, the region electrode 930D may be formed of the conductive layer M1, the region electrode 930C may be formed of the conductive layer M2, the region electrode 930B may be formed of the conductive layer M3, and the region electrode 930A may be formed of the conductive layer M4. Also, the voltage traces 912A-912D may be formed of the conductive layer M4, so that the voltage trace 912A may be directly connected to the region electrode 930A, the voltage trace 912B may be electrically connected to the region electrode 930B through the contact hole 92 of the insulating layer IN3, the voltage trace 912C may be electrically connected to the region electrode 930C through the contact hole 94 of the insulating layer IN3 and the insulating layer IN2, and the voltage trace 912D may be electrically connected to the region electrode 930D through the contact hole 96 of the insulating layer IN3, the insulating layer IN2 and the insulating layer IN1.

Figure 10:
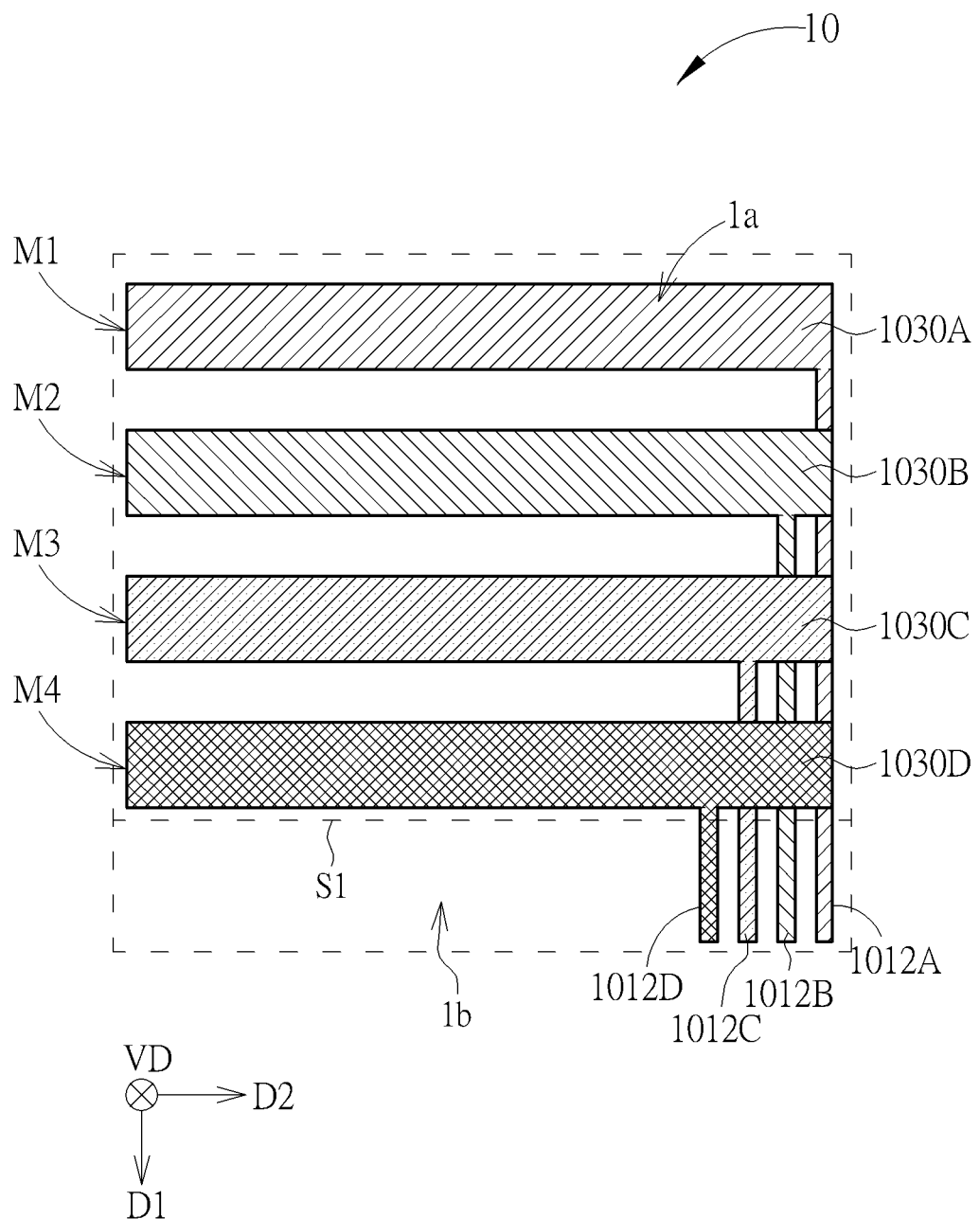
FIG. 10 is a schematic diagram illustrating a top view of an electronic device according to a tenth embodiment of the present disclosure.

FIG. 10 is a schematic diagram illustrating a top view of an electronic device according to a tenth embodiment of the present disclosure. For clarity, FIG. 10 shows only the voltage traces and the region electrodes, but not limited thereto. A difference between the electronic device 10 provided in this embodiment and the sixth embodiment shown in FIG. 6 is that the region electrodes 1030A-1030D are formed of different conductive layers, and each of the voltage traces 1012A-1012D and a corresponding one of the region electrodes 1030A-1030D are formed of the same conductive layer. Specifically, the region electrode 1030A and the voltage trace 1012A are formed of the conductive layer M1, the region electrode 1030B and the voltage trace 1012B are formed of the conductive layer M2, the region electrode 1030C and the voltage trace 1012C are formed of the conductive layer M3, and the region electrode 1030D and the voltage trace 1012D are formed of the conductive layer M4. Hence, no contact hole is required in this embodiment.

In some embodiments, the technical features in above embodiments may be replaced, recombined, or mixed with one another without departing from the spirit of the present disclosure.

In summary, in the electronic device of the present disclosure, since the voltage trace electrically connected to the region electrode farther from the voltage source module and the voltage trace electrically connected to the region electrode closer to the voltage source module are insulated from each other, the driving voltage received by the region electrode farther from the voltage source module can be compensated to be close to or equal to the driving voltage received by the region electrode closer to the voltage source module by providing different driving voltages to different voltage traces. Accordingly, the sub-pixels in different regions may be operated under the same driving voltage, thereby improving uniformity of image brightness of the electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a first voltage trace;
   a second voltage trace electrically insulated from the first voltage trace;
   a plurality of first pixels and a plurality of second pixels;
   a first region electrode electrically connected to the first voltage trace, wherein the first voltage trace is electrically connected to the plurality of first pixels through the first region electrode;
   a second region electrode electrically connected to the second voltage trace, wherein the second voltage trace is electrically connected to the plurality of second pixels through the second region electrode; and
   a voltage source module providing a first driving voltage to the first voltage trace and providing a second driving voltage to the second voltage trace, wherein the first driving voltage is different from the second driving voltage.

2. The electronic device as claimed in claim 1, wherein the first region electrode is farther from the voltage source module than the second region electrode, and the first driving voltage is greater than the second driving voltage.

3. The electronic device as claimed in claim 2, wherein the electronic device has a display region and a peripheral region outside the display region, the first region electrode and the second region electrode are disposed in the display region, the first voltage trace extends from the peripheral region to the first region electrode, and the second voltage trace extends from the peripheral region to the second region electrode.

4. The electronic device as claimed in claim 1, wherein the voltage source module has a plurality of voltage output terminals, and two of the plurality of voltage output terminals are electrically connected to the first voltage trace and the second voltage trace respectively.

5. The electronic device as claimed in claim 1, wherein an equivalent resistance of the first voltage trace is different from an equivalent resistance of the second voltage trace.

6. The electronic device as claimed in claim 1, wherein the voltage source module is a voltage source controlled by one control device.

7. The electronic device as claimed in claim 1, further comprising another first voltage trace electrically connected to the first region electrode.

8. The electronic device as claimed in claim 1, further comprising a plurality of sub-pixels and a common voltage line, wherein the common voltage line is electrically connected to the sub-pixels.

9. The electronic device as claimed in claim 1, further comprising a sub-pixel and another sub-pixel for generating different colors, wherein the first region electrode comprises two region electrodes insulated from each other, and the region electrodes are electrically connected to the sub-pixels respectively.

\* \* \* \* \*